United States Patent [19]

Kawana et al.

[11] Patent Number: 5,568,416
[45] Date of Patent: Oct. 22, 1996

[54] ASSOCIATIVE MEMORY

[75] Inventors: Keiichi Kawana; Masato Yoneda; Masahiro Konishi, all of Chiba, Japan

[73] Assignee: Kawasaki Steel Corporation, Hyogo, Japan

[21] Appl. No.: 408,718

[22] Filed: Mar. 22, 1995

[30] Foreign Application Priority Data

Mar. 24, 1994 [JP] Japan .................................. 6-054139
Sep. 14, 1994 [JP] Japan .................................. 6-220307

[51] Int. Cl.$^6$ ................................................. G11C 15/00
[52] U.S. Cl. ........................................ 365/49; 365/189.12
[58] Field of Search ................................ 365/49, 189.05, 365/189.12, 189.07

[56] References Cited

U.S. PATENT DOCUMENTS

| | | | |
|---|---|---|---|
| 5,036,486 | 7/1991 | Noguchi et al. | 365/49 |
| 5,319,589 | 6/1994 | Yamagata et al. | 365/49 |
| 5,406,508 | 4/1995 | Hayshibara | 365/49 |
| 5,428,565 | 6/1995 | Shaw | 365/49 |

FOREIGN PATENT DOCUMENTS

| | | |
|---|---|---|
| 59-40396 | 3/1984 | Japan. |
| 6-236692 | 8/1994 | Japan. |

Primary Examiner—Tan T. Nguyen
Attorney, Agent, or Firm—Oliff & Berridge

[57] ABSTRACT

An associative memory device is cascade-connected to form an associative memory. The associative memory device includes a retrieval result register for storing a retrieval result of the lo associative memory device and the retrieval result of the associative memory devices of an upstream side of the associative memory device. An identification code register stores an identification code that indicates whether the associative memory device is a last stage associative memory device of the cascade-connected associative memory devices. If the associative memory device is the last stage associative memory device, the retrieval result stored in the retrieval result register is output. The associative memory outputs the retrieval result only when a signal instructing an output of the retrieval result is received.

20 Claims, 11 Drawing Sheets

ASSOCIATIVE MEMORY

BACKGROUND OF THE INVENTION

1. Field of the Invention

The present invention relates to an associative memory in which a plurality of storage data are previously stored and a reference data is then inputted thereto in order to retrieve the storage data corresponding to the inputted reference data.

2. Description of the Related Art

Hitherto, there has been proposed an associative memory or a content addressable memory provided with the retrieval function as described above.

FIG. 1 is a circuit block diagram of the conventional associative memory by way of example.

An associative memory 10 is provided with a large number of memory words 11_1, 11_2, ..., 11_n, each consisting of a memory cell of 32 bits arranged in the transverse direction of the figure, a word being expressed, for example, with 32 bits. Moreover, the associative memory 10 comprises a reference data register 12 which is adapted to latch a word of reference data and a mask data register 13 arranged to store mask data to mask the reference data for each bit in order to compare a bit pattern of the whole or the predetermined part of the reference data not masked with the mask data stored in the mask data register 13 among the reference data latched in the reference data register 12 with a bit pattern of the part corresponding to above bit pattern among the storage data stored in each memory word 11_1, 11_2, ..., 11_n to detect match or mismatch therebetween. A match signal of a logic "1" is outputted to the match lines 14_1, 14_2 ..., 14_n for the memory words 11_1, 11_2, ..., 11_n of which bit pattern is matched among the match lines 14_1, 14_2, ..., 14_n provided corresponding to respective memory words 11_1, 11_2, ..., 11_n. Meanwhile, a logic "0" appears on the other match lines 14_1, 14_2 ..., 14_n.

The signals outputted to these match lines 14_1, 14_2, ..., 14_n are stored in each match flag register 15_1, 15_2, ..., 15_n. Here, assuming that, as an example, the signals "0", "1", "1", "0", ... "0", "0" are respectively stored in the match flag registers 15_1, 15_2, ..., 15_n, the signals stored in these match flag registers 15_1, 15_2, ..., 15_n are inputted to an address encoder 16. Thereby, this address encoder 16 outputs an address signal corresponding to the highest priority match flag register among the match flag registers (here, only two match flag registers 15_2 and 15_3) which stores the signal of a logic "1." Supposing that the priority is higher as the number of suffix of the reference numeral is younger, the memory address associated with the match flag register 15_2 is therefore outputted. An address signal AD outputted from this address encoder 16 is then inputted to a decoder 17, if necessary. The decoder 17 decodes the received address signal AD and outputs an access signal to any associated one (here, a word line 18_2) corresponding to the address signal AD of the word lines 18_1, 18_2, ..., 18_n provided corresponding respectively to the memory words 11_1, 11_2, ..., 11_n. As a result, data stored in the memory Word 11_2 associated with the word line 18_2 on which the access signal appears is read out to an output register 19.

FIG. 2 is a detailed circuit diagram illustrating a memory word in the associative memory shown in FIG. 1.

This memory word 11 is composed of 32 memory cells 11_1, 11_2, ..., 11_32 of the same structure. Each memory cell 11_1, 11_2, ..., 11_32 is respectively provided with a first inverter 20_1, 20_2, ..., 20_32 and a second inverter 21_1, 21_2, ..., 21_32 with the outputs thereof connected to the inputs thereof and these inverters 20_1, 20_2, ..., 20_32; 21_1, 21_2, ..., 21_32 operate to store the one bit of a logic "1" or a logic "0" to each memory cell 11_1, 11_2, ..., 11_32.

In each memory cell 11_1, 11_2, ..., 11_32, outputs of the first inverters 20_1, 20_2, ..., 20_32 are connected to the bit lines 23_1, 23_2, ..., 23_32 via the transistors 22_1, 22_2, ..., 22_32 and the gates of these transistors 22_1, 22_2, ..., 22_32 are connected to the word line 24. In addition, outputs of the second inverters 21_1, 21_2, ..., 21_32 are connected to the bit bar lines 26_1, 26_2, ..., 26_32 via the transistors 25_1, 25_2, ..., 25_32 and the gates of these transistors 25_1, 25_2, ..., 25_32 are also connected to the word line 24. Furthermore, two transistors 27_1, 28_1; 27_2, 28_2; ...; 27_32, 28_32 connected in series are respectively arranged in each memory cell 11_1, 11_2, ..., 11_32 to connect between the bit lines 23_1, 23_2, ..., 23_32 and the bit bar lines 26_1, 26_2, ..., 26_32 and the gates of the one transistors 27_1, 27_2, ..., 27_32 among these two transistors 27_1, 28_1; 27_2, 28_2; ...; 27_32, 28_32 are connected to the outputs of the first inverters 20_1, 20_2, ..., 20_32, while the gates of the other transistors 28_1, 28_2, ..., 28_32 are connected to the outputs of the second inverters 21_1, 21_2, ..., 21_32.

On the other hands, the match line 140 is provided with transistors 290_1, 290_2, ..., 290_32 which are associated one by one with each memory cell 11_1, 11_2, ..., 11_32. These transistors 290_1, 290_2, ..., 290_32 are connected in series with each other and each gate of the transistors 290_1, 290_2, ..., 290_32 is connected to the neutral point of respective couple of the transistors 27_1, 28_1; 27_2, 28_2; ...; 27_32, 28_32.

In addition, this match line 140 is also connected with an other transistor 290_O in series and the left end in FIG. 2 of this match line 140 is grounded via this transistor 290_O. The gate of this transistor 290_O is connected to a control line 300. Moreover, the right side in FIG. 2 of this match line 140 is provided with an inverter 310. The match line 140 is also extended to the output side of this inverter 310 and is connected to each match flag register 15_1, 15_2, ..., 15_n (refer to FIG. 1). A couple of P type transistors 320, 330 are provided between an input of this inverter 310 and the power supply $V_{DD}$ and the gate of one P type transistor 320 is connected to the control line 300, while the gate of the other P type transistor 330 to the output of the inverter 310.

The match condition is retrieved as explained hereunder in an associative memory comprising memory words having the structure and the peripheral circuits explained above.

First, a logic "0" appears on the control line 300, making conductive the P type transistor 320 in order to precharge the match line 140. In this case, the transistor 290_O is turned to the non-conductive state, certainly disconnecting the match line 140 from the ground line. Thereby, precharge is certainly performed. After the match line 140 is precharged, the retrieval operation is performed.

Here, it is assumed that the information of a logic "1" is stored in the memory cell 11_1. That is, in this case, a logic "1" appears on the output side of the first inverter 20_1, while a logic "0" on the output side of the second inverter 21_1.

Assuming that logic "1" is retrieved for the memory cell 11_1, the bit line 23_1 is set to logic "1", while the bit bar line 26_1 is set to logic "0". The word line 24 is maintained in the state of a logic "0". Moreover, the control line 300 is set to logic "1", making conductive the transistor 290_O. In this case, a voltage of logic "1" is impressed to the gate of transistor 27_1 and a signal of logic "1" on the bit line 23_1 is impressed to the gate of transistor 290_1, making conductive the transistor 290_1. Namely, when the bit information stored in the memory cell 11_1 coincides with the bit information in the reference data inputted through the bit line 23_1 and the bit bar line 26_1, the corresponding transistor 290_1 is turned to conductive state.

Also, assuming that information of a logic "0" is stored in the memory cell 11_2, the output side of the first inverter 20_2 is set a logic "0" while the output side of the second inverter 21_2 is set a logic "1".

Here, it is also supposed that the state of a logic "1" is retrieved for the memory cell 11_2. Namely, the bit line 23_2 is set to a logic "1", the bit bar line 26_2 to a logic "0" and the control line 300 to a logic "1". In this case, a signal on the bit bar line 26_2 being set to a logic "0" via the transistor 28_2 is inputted to the gate of the transistor 290_2 and thereby this transistor 290_2 is maintained under the non-conductive state. That is, in the case of mismatch, charges precharged in the match line 14 are not discharged.

For the masked bits, both bit line 23_32 and bit bar line 26_32 are set to a logic "1" as illustrated in the memory cell 11_32. In this case, any one of the transistor 27_32 and transistor 28_32 becomes conductive depending on that the information of a logic "1" or a logic-"0" is stored in the memory cell 11_32. In any case, the transistor 290_32 becomes conductive.

As described, in the memory word shown in FIG. 2, when the bit pattern stored in the memory word coincides with the bit pattern of the reference data inputted through the bit lines 23_1, 23_2, ..., 23_32 and the bit bar lines 26_1, 26_2, ..., 26_32 (the masked bits are considered to be matched as explained above), the charge precharged in the match line 140 flows through the transistors 290_32, ..., 290_2, 290_1, 290_O. Thereby the match line 140 is discharged, causing the left side from the inverter 310 shown in FIG. 2 of the match line 140 to be turned to the state of a logic "0". This logic "0" is inverted by the inverter 310 and the match signal of logic "1" is outputted from the inverter 310 and is then inputted to the match flag registers 15_1, 15_2, ..., 15_32 (refer to FIG. 1).

When the bit pattern stored in the memory word does not coincide with the bit pattern of the reference data inputted through the bit lines 23_1, 23_2, ..., 23_32 and the bit bar lines 26_1, 26_2, ..., 26_32, the match line 140 is left in the state of a logic "1" by way of the precharge. This logic "1" is then inverted by the inverter 310 and thereby a mismatch signal of a logic "0" is outputted.

As explained, the memory word illustrated in FIG. 2 is so structured that the match line 140 is precharged prior to the retrieval via the P type transistor 320, and is discharged through the transistors 290_O, 290_1, ..., 290_32 only when match is detected by the retrieval operation. Therefore, in many cases, only a small number of the many match lines are discharged for each retrieval operation and the greater number of the match lines are maintained in a precharged condition. Consequently, only the small number of match lines must be precharged again prior to the next retrieval operation, resulting in reduction of power consumption required for retrieval operation.

A circuit structure illustrated in FIG. 2 is only one example of the prior art and many modifications are known or considered.

If only one associative memory results in shortage of memory capacity in the associative memory structured as explained above, it is thought for making access to establish cascade-connection of a plurality of associative memories (refer to, for example, Japanese Patent Laid-open No. Sho 59-40396 and Japanese Patent Application No. Hei 5-159724 (not yet laid open). In this case, it is preferable that access to a plurality of cascade-connected associative memories can be realized from external circuits only with input or output of the signal similar to that used for making access to only one associative memory.

The Japanese Patent Laid-open No. Sho 59-40396 and Japanese Patent Application No. Hei 5-159724 listed above have proposed the technology that on the occasion of utilizing a function of this associative memory as an ordinary RAM memory to write data to a memory address by designating such address and to read the data from such memory address, the expansion technique of ordinary RAM memory to use ID numbers for discriminating RAM memories as the upper addresses for each RAM memory can be used in direct and the priority for a plurality of integrated associative memories is established also for a priority encoder and so-on. However, it is a problem how to read the contents of the retrieval result register, provided in each associative memory, to which the retrieval result is inputted. It is not preferable, here, to read the contents of the retrieval result register of a plurality of cascade-connected associative memories by designating the ID number of each associative memory, because it has to be considered from the external circuit that a plurality of associative memories are provided.

SUMMARY OF THE INVENTION

In view of the foregoing, it is therefore a first object of the present invention to provide an output of the necessary retrieval result only by simultaneously inputting a signal for instructing outputs of the retrieval result to a plurality of cascade-connected associative memories.

It is a second object of the present invention to provide a data output function which is not required to change respective chips from the external side and prevents duplicated output of data.

It is a third object of the present invention to reduce the number of wirings between the associative memories in view of realizing cost-down by eliminating necessity of shifting the signals including a large amount of information such as address information to the associative memories in the next stage.

To achieve the above-mentioned first object of the present invention, there is provided an associative memory, which is cascade-connected with each other and have an expanded function to be simultaneously accessed, for conducting retrieval for memory words in which the storage data is stored corresponding to the inputted reference data by storing each storage data to a plurality of memory words and then inputting thereto the reference data, comprising:

a retrieval result register for storing retrieval result of own associative memory and the associative memories connected to upstream side, which can be read by external devices;

an identification means for discriminating whether own associative memory is connected to the last stage of the cascade connection; and an output control circuit for outputting retrieval result stored in the retrieval result register when the last stage connection is detected by the identification means upon access to the retrieval result register.

Since an associative memory according to the first invention is provided with the retrieval result register for storing the retrieval result of own associative memory and those connected to upstream side, the retrieval results of all cascade-connected associative memories are stored in the retrieval result register of the associative memory connected to the last stage of cascade connection.

Moreover, an associative memory according to the first invention is provided with the identification means for discriminating whether own associative memory is connected to the last stage of the cascade connection or not and also outputs a retrieval result stored in the retrieval result register when the last stage connection is detected by the identification means of the own associative memory.

According to an associative memory of the first aspect of the present invention, an associative memory which is formed by cascade connection of a plurality of associative memories and ensures access from external devices without consideration on that a plurality of associative memories are connected can be realized, because the necessary retrieval results are outputted only by simultaneously inputting a signal for instructing output of the retrieval results to a plurality of cascade-connected associative memories. Namely, the overall retrieval results of all associative memories can be obtained only by inputting a signal for instructing output of the retrieval result without being conscious of existence of a plurality of associative memories from the external devices.

An associative memory according to the second aspect for achieving the second object thereof has a storage area to store the data which simultaneously allows reading of the data. More specifically, the associative memory of the present invention relates to an associative memory where a plurality of associative memories are cascade-connected with each other and are also connected to a common output data bus and the data stored in the storage areas of these associative memories are sequentially outputted to the output data bus and is characterized in that the storage area has a first area for storing a first data which is common to a plurality of associative memories and a second area for storing a second data which differed from each associative memory. Furthermore, the associative memory comprises: a priority signal input terminal for inputting a first priority signal which indicates that any one of associative memories connected to the stage side preceding to a certain associative memory among a plurality of associative memories has the data output priority; a priority signal output terminal for outputting a second priority signal which indicates that a certain associative memory or any one of associative memories connected to the stage side preceding to a certain associative memory among a plurality of associative memories has the data output priority; a priority flag storing circuit for storing priority flag which indicates that the second data stored in the second area is not yet read and is reset when the second data is read; a priority transfer circuit which outputs, when the first priority signal is inputted from the priority input terminal or when the priority flag is stored in the priority flag storing circuit, the second priority signal from the priority output terminal and cancels output of the second priority signal when input of the first priority signal is stopped and the priority flag is reset; and a data output control circuit for controlling data output so that the first data stored in the first area is outputted only once from any one of a plurality of associative memories depending on whether the first priority signal is inputted from the priority signal input terminal and whether the priority flag is stored in the priority flag storing circuit on the occasion of sequentially outputting the data stored in the storage areas of a plurality of associative memories to the output data bus.

Here, the data output control circuit is not limited to those having a particular structure but the data output control circuit may be provided, for example, with; an address update circuit for updating a read address each time only one data stored in each read address of the storage area is read, and maintaining it in the read heading address when the first priority signal is inputted while continuously updating the read address after input of the first priority signal is stopped in the case where the read address is updated to the read heading address in the second area; and a data transfer circuit which intercepts transfer to output data bus of the data read from the storage area while the first priority signal is inputted, transfers the data read from the storage area to the output data bus until the priority flag is reset after input of the first priority signal is stopped and intercepts again the transfer of data read from the storage area to the output data bus after the priority flag is reset.

Here, it is also possible that a last stage connection recognizing means is provided to recognize that a certain associative memory is connected to the last stage of the cascade connection and the data transfer circuit is so structured that the transfer of data read from the storage area to the output data bus can be continued even after the priority flag is reset when the connection to the last stage of the cascade connection is recognized by the last stage connection recognizing means.

Moreover, when the storage area comprises a plurality of second areas divided into a plurality of read address areas, one priority flag storing circuit may be provided correspondingly to a plurality of second areas and the address update circuit cyclicly outputs the read addresses of a plurality of second areas. Otherwise, when the storage area comprises a plurality of second areas divided into a plurality of read-out address areas, one priority signal input terminal, one priority signal output terminal and one priority flag storing circuit may respectively be provided correspondingly to each of the second areas.

The associative memory of the second aspect of the present invention is provided with the data output control circuit explained above, for example, comprising the read-out address update circuit and the data transfer circuit explained above. Therefore, the associative memory of the present invention assures high speed data output without designating the associative memory which outputs the data among a plurality of associative memories of cascade connection and without duplicated output of data common to a plurality of associative memories.

Here, when the last stage connection recognizing means is provided and the data transfer circuit is structured to continue, even after the priority flag is reset, the transfer of data read from the storage area to the output data bus in case the last stage connection is recognized by the last stage recognizing means, the necessary data can all be outputted without duplicated output of data even if the first area (33 in FIG. 8) for storing the data common to a plurality of associative memories exists, as shown 32 in FIG. 8, in the later read-out sequence than the second areas $32a, \ldots, 32k$, ... for storing data differed from each associative memory.

Moreover, when the storage area has a plurality of second areas, each of which being divided into a plurality of read-out address areas, it may be possible that only one priority flag storing circuit is provided correspondingly to a plurality of second areas and the address update circuit explained above is structured to cyclicly output the read-out addresses of these second areas. Or a set of the priority signal output terminal, priority signal output terminal and priority flag storing circuit may be provided correspondingly to each one of the second areas. In any case of such structure, the necessary data can be outputted sequentially without duplicated output of data even when the storage area has a plurality of second areas each of which is divided into a plurality of address areas.

According to the second aspect of the present invention, a plurality of cascade-connected associative memories can output only once the data common to a plurality of associative memories and sequentially and completely output the data differed from each associative memory without execution of complicated controls such as changing of chips from the external circuits, thereby ensuring effective data output and improving effective operation speed as a system.

The associative memory according to the third aspect of the present invention to achieve the third object is characterized by comprising: a retrieval result register for storing a retrieval result of the status of a certain associative memory and a system as a whole of the associative memories connected to upstream side, which can be read by external devices; an identification means for discriminating whether own associative memory is connected to the last stage of the cascade connection; a priority signal input terminal for inputting a priority signal which indicates that any one of associative memories connected to the stage side preceding to the own associative memory among a plurality of associative memories has the priority for output of data having a large amount of information including the address signal; and an output control circuit which outputs, when the status for the system as a whole is accessed, a retrieval result stored in the retrieval result register in such a case that the last stage connection is detected by the identification means and outputs, when the data including a large amount of information is accessed, a retrieved data in such a case that the associative memories connected to the stage side preceding to the own associative memory does not have the priority and the retrieved data is stored in the storage area of the own associative memory.

According to the third aspect which is a combination of the first aspect and second aspect, a retrieval result of status regarding the system as a whole may be sequentially shifted and can be outputted from the associative memory of the last stage. On the other hand, the data including a large amount of information such as address information is not shifted to the next stage and is outputted in direct from the associative memory having the priority. Therefore, wirings between the associative memories can be reduced to realize cost-down.

BRIEF DESCRIPTION OF THE DRAWINGS

The above object, features and advantages of the present invention, as well as other objects and advantages thereof, will become more apparent from the description of the invention which follows, taken in conjunction with the accompanying drawings, wherein like reference characters designate the same or similar parts and wherein.

DESCRIPTION OF THE PREFERRED EMBODIMENTS

Preferred embodiments of the present invention will be explained hereunder.

Figure 1:
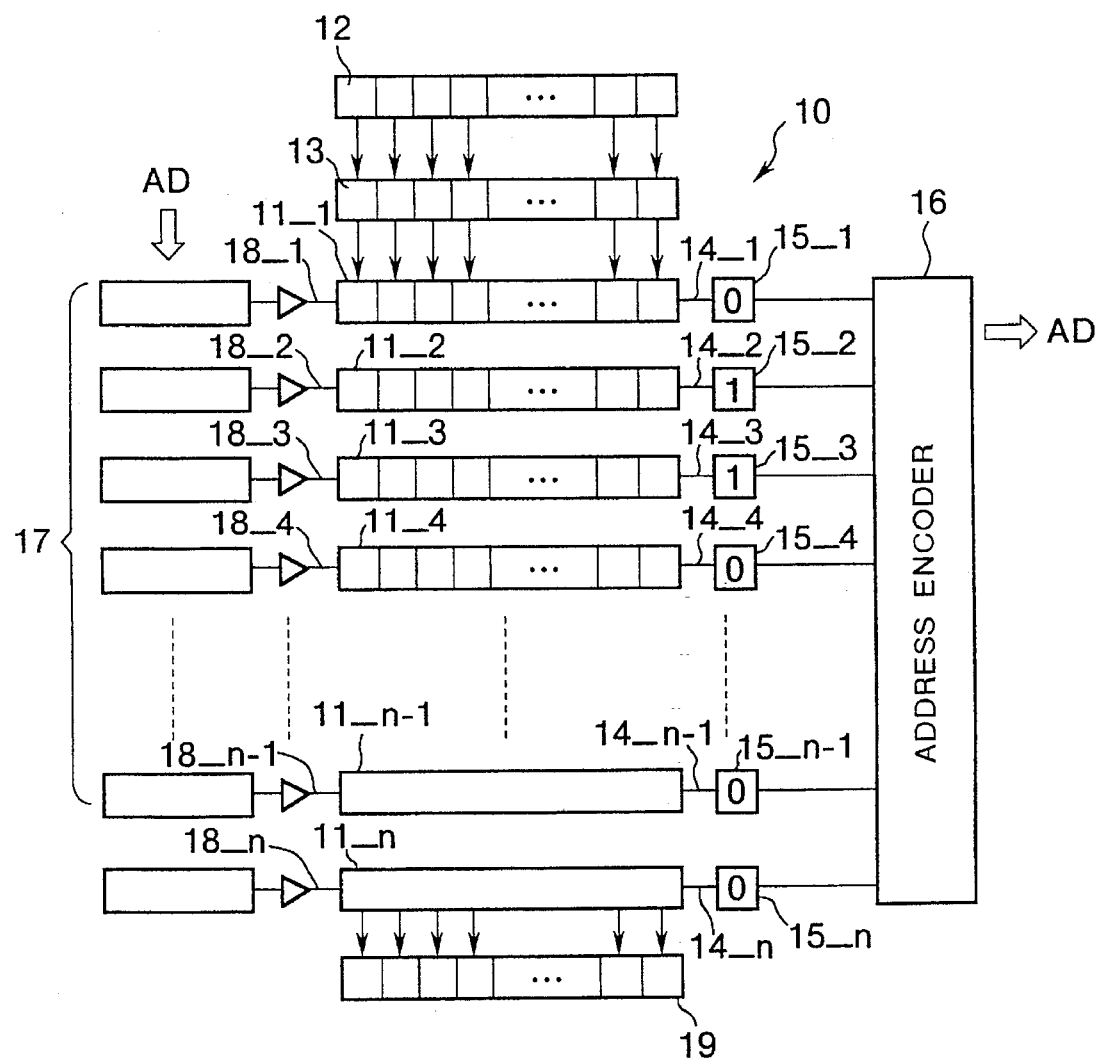
FIG. 1 is a circuit block diagram illustrating a conventional associative memory by way of example.
Figure 2:
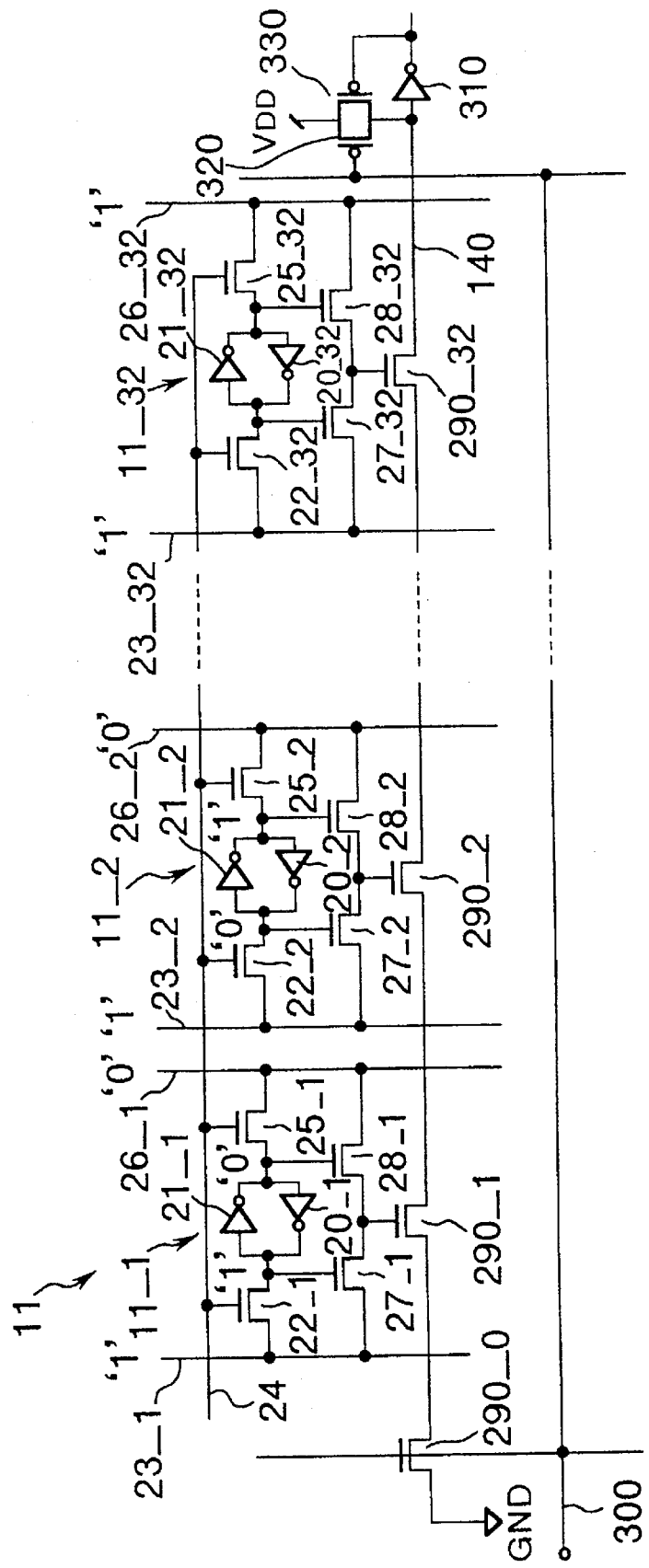
FIG. 2 is a detailed circuit diagram illustrating a memory word of the associative memory shown in FIG. 1.
Figure 3:
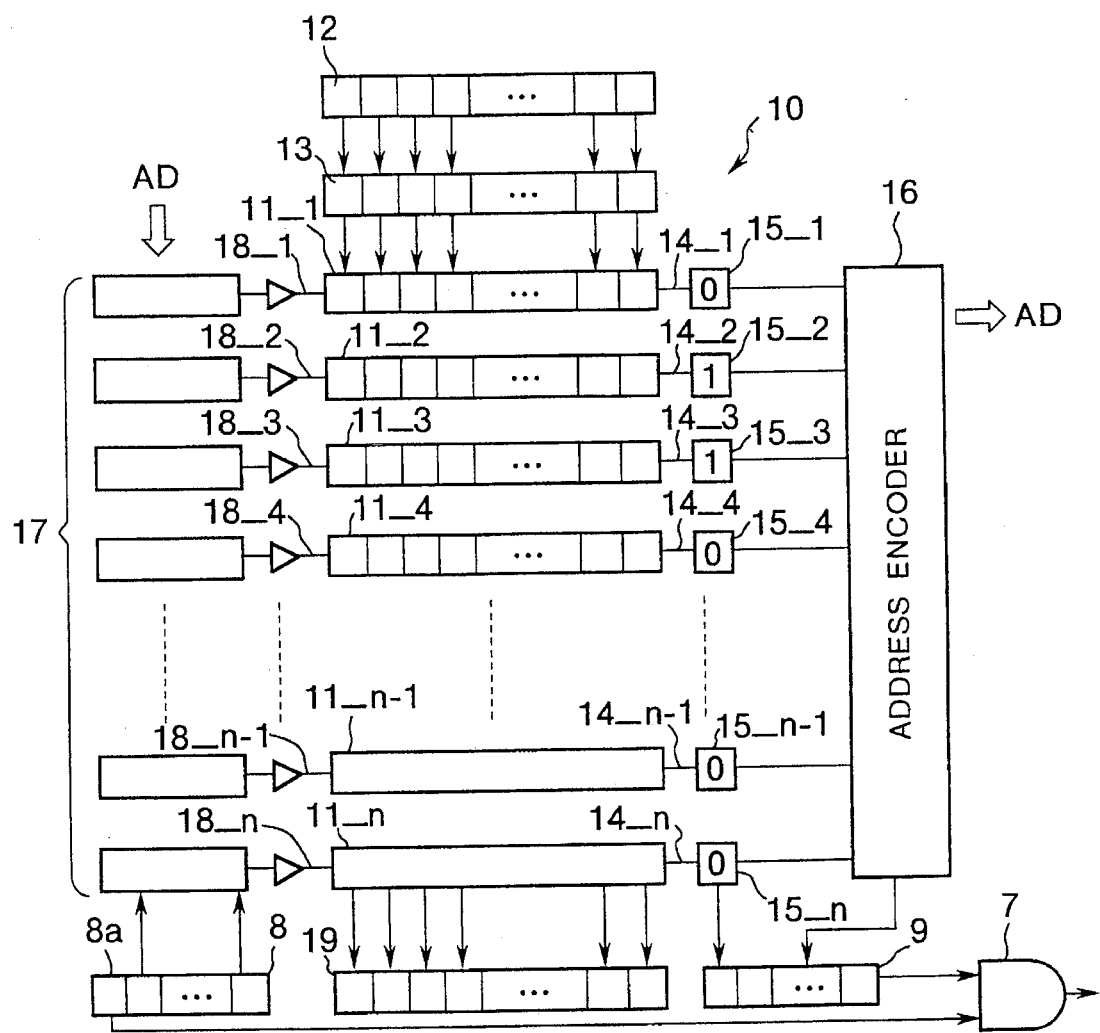
FIG. 3 is a circuit block diagram illustrating a first embodiment of an associative memory according to the present invention.

FIG. 3 is a circuit block diagram illustrating a first embodiment of an associative memory according to the present invention. The composing elements associated with that of the conventional associative memory shown in FIG. 1 are designated by the reference numerals like those in FIG. 1 and only difference will be explained.

An associative memory shown in FIG. 3 is provided with an ID number register 8 for storing the ID number of this associative memory. This ID number is used for identifying a plurality of cascade-connected associative memories and is also used as the upper address of the address data AD inputted from the external devices. However, the most significant bit 8a of the ID number register 8 is always stored as a logic "0" as the ID number and as a logic "1" when own associative memory is connected to the last stage of the cascade connection (including the case where the associative memory is used as a single unit).

In this embodiment, the most significant bit 8a of the ID number register 8 is the identification means of the present invention. The identification means may be a register or a terminal.

The associative memory of the present invention is also provided with a retrieval result register 9. In this retrieval result register 9, whether match or mismatch is detected in the associative memory is stored at the time of retrieval and when match is detected, an address of the memory word in which match is detected is stored. Moreover, when a plurality of associative memories are cascade-connected, whether match is detected or not in the associative memories connected to the upstream side and an address of memory word, when match is detected therein, are respectively inputted to such associative memory. In this case, whether match is detected by itself or not, whether match is detected in the associative memories connected to the upstream side or not and the address having highest priority for which match is detected among the addresses including own associative memory and the associative memories connected to the upstream side are stored in the retrieval result register 9. Contents of this retrieval result register 9 can be read through the output control circuit 7 only when a logic "1" is stored in the most significant bit 8a of the ID number register 8.

Figure 4:
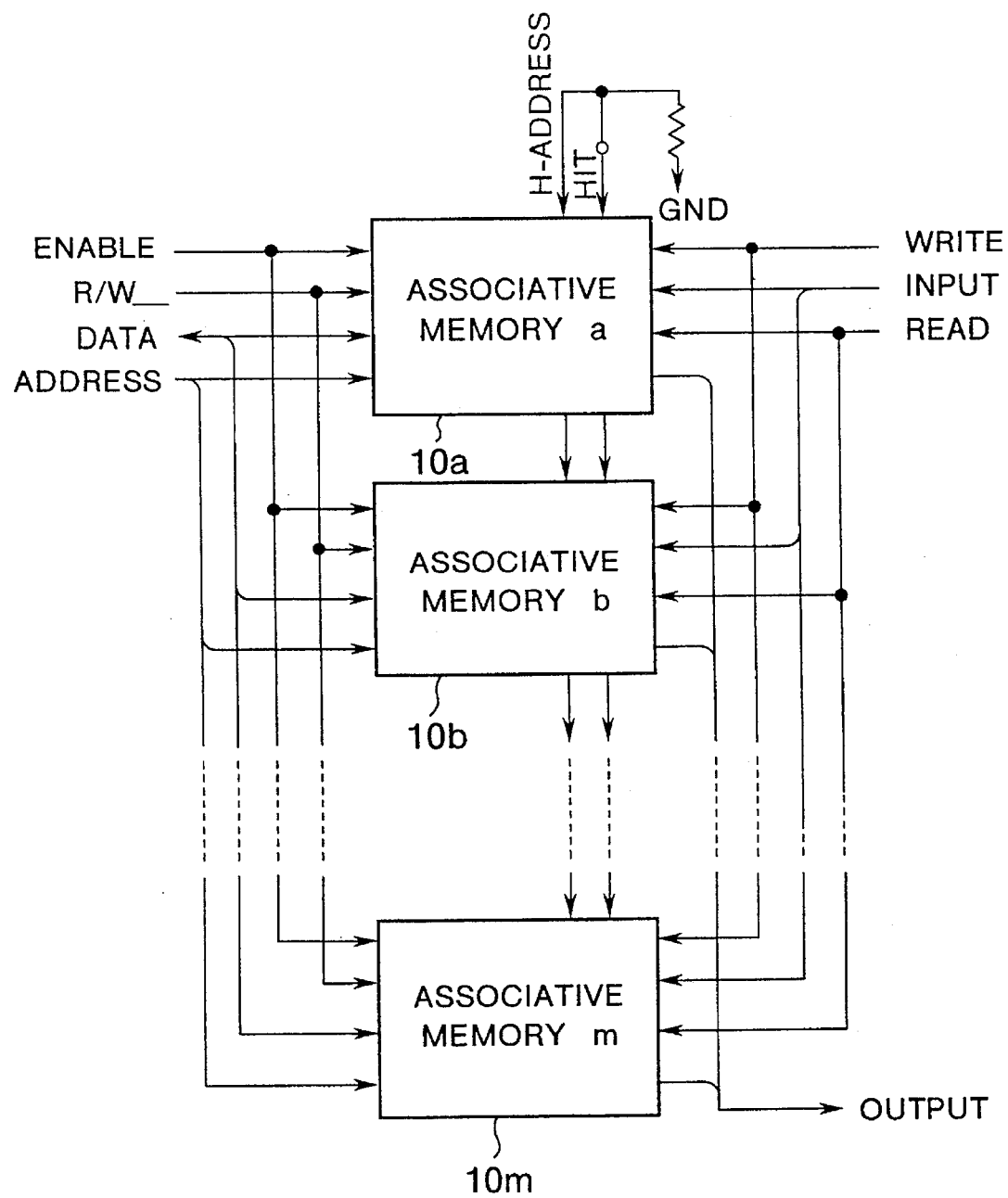
FIG. 4 is a schematic diagram illustrating cascade-connected associative memories illustrated in FIG. 3.

FIG. 4 is a schematic diagram where the associative memories illustrated in FIG. 3 are cascade-connected. In this figure, the m associative memories of the same specification are cascade-connected and these m associative memories are accessed simultaneously from the external side as if only one associative memory having a large capacity were provided as will be explained later.

In these m associative memories, a hit signal HIT representative of whether match is detected or not in the associative memories of the upstream side and an address signal H_ADDRESS having the highest priority, when match is detected, are transmitted to the associative memories in the downstream side. Here, it is assumed that the higher priority is given to the associative memories in the upstream side illustrated in the figure. As the hit signal HIT and the address signal H_ADDRESS of the first associative memory, a logic "0" indicating that match is not detected in the upstream side memories and that address where match is detected does not exist are inputted.

In the case of writing data into these associative memories in the same manner as an ordinary RAM memory, the R/W_signal is set to a logic "0" to inform start of the "write" operation. Next, the data DATA and address ADDRESS to be written are designated and thereafter an ENABLE signal is inputted. In this case, the ID number of each associative memory is used as an upper address and an address data having the upper address is inputted as the address ADDRESS.

In the case of reading data from this associative memory, the R/W_signal is also set to a logic "1" to inform start of the "read" operation. An address ADDRESS setting the ID number as the upper address is inputted and an ENABLE signal is then inputted. Thereby, the data DATA stored in the address (including designation of the associative memory) designated by the address ADDRESS can be read.

When executing the retrieval using these associative memories, the reference data INPUT is first inputted and the WRITE signal is also inputted. Thereby, the storage data is retrieved being matched with the inputted reference data within the associative memories and the retrieval result is stored in the retrieval result register 9 as is explained with reference to FIG. 3. The retrieval result stored in the retrieval result register 9 of each associative memory is the integrated result, as is explained above, of the the retrieval result of a certain associative memory itself and that of the associative memories connected to the upstream side. Therefore, the integrated retrieval result of the system as a whole is stored in the retrieval result register of the associative memory m connected to the last stage.

This retrieval result can be detected by inputting a READ signal for instructing output of the retrieval result. Thereby, as described previously, the total retrieval result as a system stored in the retrieval register of the associative memory m of the last stage can be outputted as the output data OUTPUT.

As described, even when m associative memories are actually cascade connected, it can be operated as only one associative memory of a large capacity from the external side.

Figure 5:
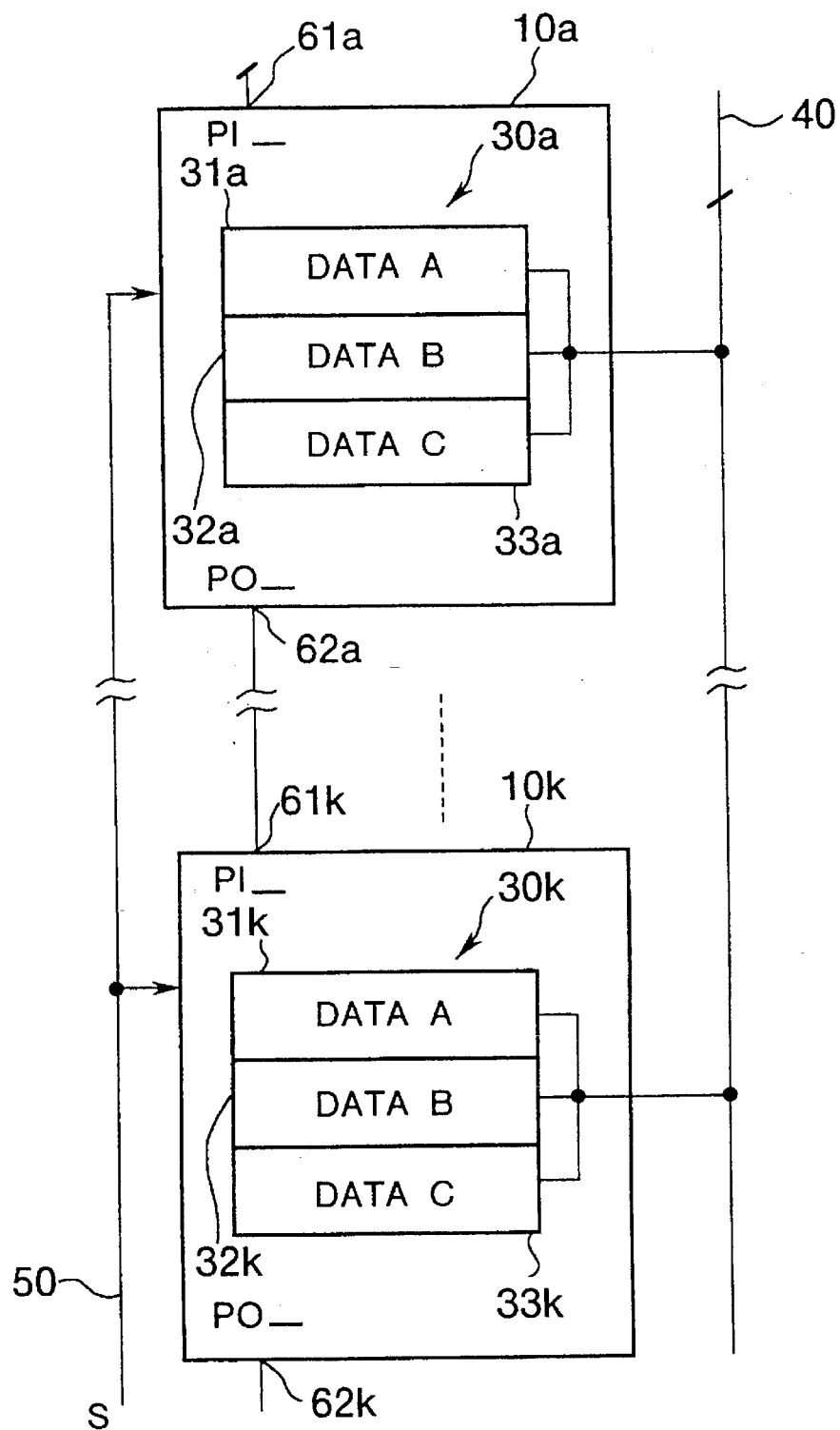
FIG. 5 is a schematic diagram illustrating details of cascade-connected associative memories.

FIG. 5 is a schematic diagram illustrating details of cascade-connected associative memories. For simplifying explanation, an associative memory may be called a "chip" in some cases.

Each chip $10a, \ldots, 10k, \ldots$ comprises storage areas $30a, \ldots, 30k, \ldots$ for storing the data which is referred from external circuits. In the first areas $31a, \ldots, 31k$, having younger addresses of the storage areas $30a, \ldots, 30k, \ldots$, the data A (one or a plurality of data) common to a plurality of chips $10a, \ldots, 10k, \ldots$ of cascade connection is stored. Moreover, the second areas $32a, \ldots, 32k, \ldots$ are arranged in the address areas posterior to the first areas $31a, \ldots, 31k, \ldots$ In this second areas $32a, 32k, \ldots$ the data B (one or a plurality of data) differed from each chip are stored. Moreover, the third areas $33a, \ldots, 33k, \ldots$ are also arranged in the address area further behind the second areas $32a, \ldots, 32k, \ldots$ In this third areas $33a, \ldots, 33k, \ldots$, the data C (one or a plurality of data) common to a plurality of chips are also assumed to be stored in the same manner as the case of the first areas $31a, \ldots, 31k, \ldots$ Here, the first areas $31a, \ldots, 31k, \ldots$ is different from the third areas $33a, \ldots, 33k, \ldots$ only in the point that one is in any address area before or after the other beyond the second areas $32a, \ldots, 32k, \ldots$ provided between these first and third areas and these two areas are common in the point that, these areas are provided for storing the data common to a plurality of chips of cascade connection. Therefore, in some cases, the area for storing the data common to a plurality of chips may be called as the "first area" without relation to the location of its actual address area.

The data common to a plurality of chips means a retrieval data in such a case that a plurality of associative memories of cascade connection are used to store the retrieval data applied from the external circuits and the data differed from each chip means the data, for example, representing the retrieval result in the individual associative memories.

A plurality of chips $10a, \ldots, 10k, \ldots$ are connected to the common output data bus 40 and control line 50. When a control signal S indicating instruction for the data output is applied to the chips via the control line 50, the data of the storage areas $30a, \ldots, 30k, \ldots$ is outputted to the output data bus 40. In this case, since each chip $10a, \ldots, 10k, \ldots$ is respectively provided with the priority signal input terminals $61a, \ldots, 61k, \ldots$ and the priority signal output terminals $62a, \ldots, 62k, \ldots$ in order to eliminate competition of data output to the output data bus 40 from a plurality of chips $10a, \ldots, 10k, \ldots$, the chips connected to the front stage side (upper side in FIG. 5) is given the higher priority for data output by sequentially connecting these terminals. That is, a first priority signal representing that any chip connected in the stage side preceding to a certain chip has the priority for data output is inputted from the priority signal input terminal $61a, \ldots, 61k, \ldots$ And while the first priority signal is being applied, a certain chip does not output the data in its own storage area to the output data bus 40 and outputs such data after the input of the first priority signal stops. Moreover, the priority signal output terminal $62a, \ldots, 62k, \ldots$ outputs the second priority signal for inhibiting data output from the chip connected in the rear stage side when the first priority signal is inputted from the priority signal input terminal $61a, \ldots, 61k, \ldots$ or the certain chip performs data output even when the input of the first priority signal stops and also stops output of the second priority signal when input of the first priority signal stops and the certain chip itself stops the data output.

With the structure as explained above, the cascade-connected chips $10a, \ldots, 10k, \ldots$ sequentially output data to the output data bus 40.

Thereby, the data is output in the format of (data A, data B, data C), ..., (data A, data B, data C), ... in the sequence of the chip $10a, \rightarrow \ldots \rightarrow$ the chip $10k \rightarrow \ldots$ As explained above, the data A and data C indicated in this example are common to a plurality of chips $10a, \ldots, 10k,$ ... of cascade connection. Therefore, when the common data exists for a plurality of chips as indicated in this example, the common data is outputted repeatedly from the chips 10a, ..., 10k, ... generating useless time in the data output time as a system consisting of the chips 10a, ..., 10k, ..., thereby resulting in the fear for deteriorating substantial operation rate as the system.

Meanwhile, it can be thought to eliminate such unuseful output that only the required number of control lines 50 is increased and individual chips 10a, ..., 10k, ... are sequentially designated one by one. For example, when the chip 10a is designated from the external circuits and the chip 10a outputs the data A and data B from its storage area 30a, the next chip 10b (not illustrated) is in turn designated to provide an output of only the data B. Moreover, the next chip 10c (not illustrated) is then designated to provide the output of data B. When the chip of the last stage is designated after repetition of such process, it is caused to output the data B and the data C. Thereby, duplicated output of data can be prevented through the controls as explained above.

However, a cycle for sequentially changing the designation of chips to provide an output is then required in the structure as described above. That is, a longer time is required for data output control, also interfering the high speed data output.

Embodiments of the present invention which has solved this problem will then be explained hereunder.

Figure 6:
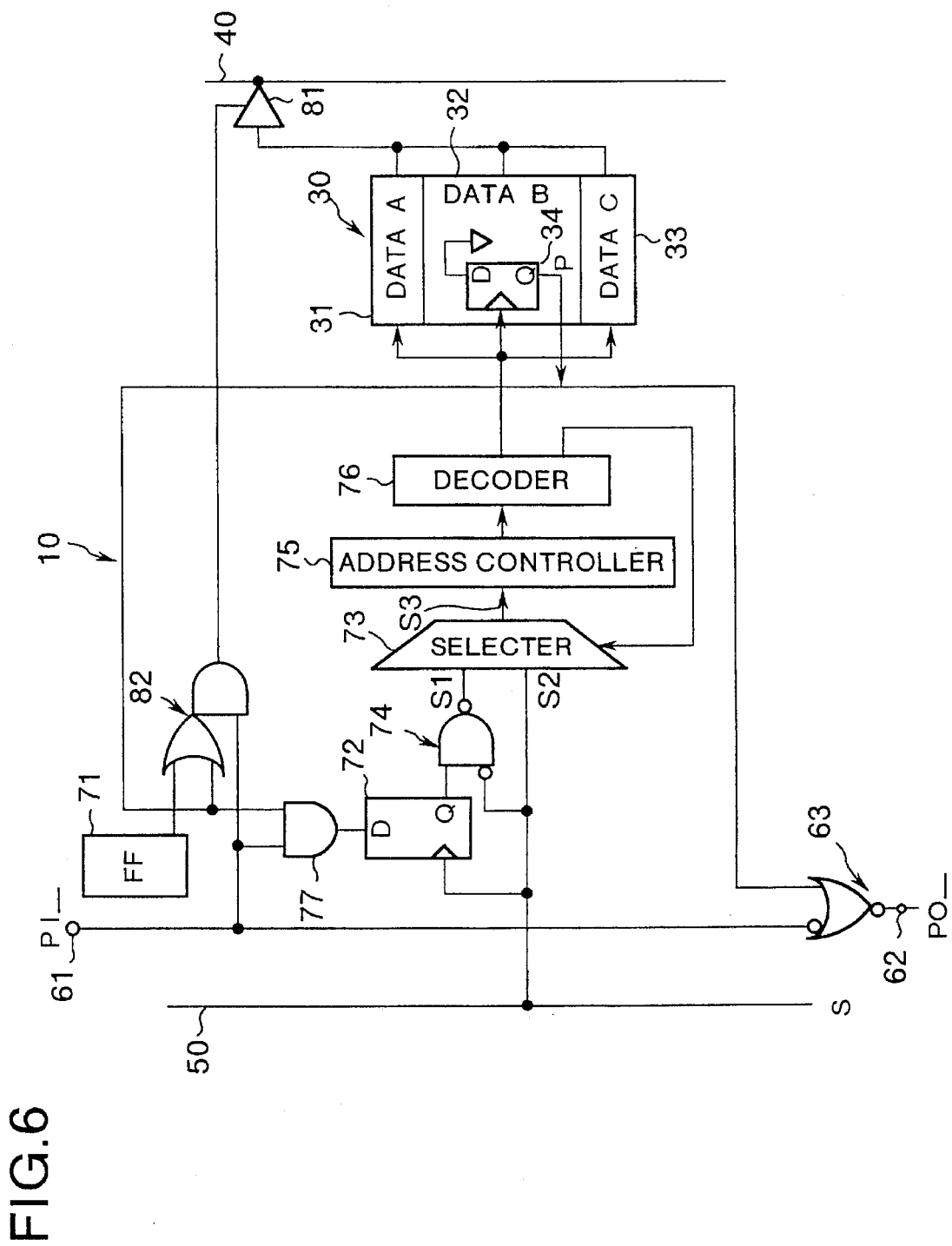
FIG. 6 is a circuit diagram of the part for data output of the second embodiment of the present invention.

FIG. 6 is a circuit diagram of the part regarding data output of the second embodiment of the present invention.

A first priority signal PI_ is inputted from the priority signal input terminal 61 of the associative memory (chip) 10 shown in FIG. 6. This first priority signal PI_ remains at the "L" level when any chip in the front stage side of the chip 10 has the priority for data output and then becomes "H" level when the data of all chips in the front stage side are outputted. When the chip 10 is located at the first stage, the priority signal input terminal 61 is pulled up so that the signal of the "H" level is always applied thereto because there is no chip having the higher priority.

When the first priority signal PI_ ("L" level signal) is inputted from the priority signal input terminal, such "L" level signal is transferred to a chip in the rear stage side as the second priority signal PO_ ("L" level signal) via a gate circuit 63.

In addition, this chip is also provided with the last stage flag register 71. A logic "1" is written in the stage of initialization to the last stage flag register of the chip connected to the last stage, while a logic "0" is written to the other chips. When a logic "1" or a logic "0" is written to the last stage flag register 71, the last stage flag register 71 outputs the signal of "H" level or "L" level.

The storage area 30 of the chip 10 comprises a first area 31 for storing, in the sequence of read addresses, the data A common to a plurality of cascade-connected chips, a second area 32 for storing the data B differed from each chip and a third area 33 for storing the data C common to a plurality of chips like the first area 31. In this second embodiment, for discrimination purpose, the area having a younger read address than that of the second area 32 to store the data common to a plurality of chips is called the first area 31 and the area having an older read address than that of the second area 32 to store the data common to a plurality of chips is called the third area 33. However, these first and third areas 31, 33 respectively correspond to the first area in the present invention.

The chip 10 is provided with a priority flag register 34 corresponding to the second area 32 of the storage area 30.

In this embodiment, when the data B is stored in the second area 32, the priority flag is stored in this priority flag register 34 and the stored priority flag is reset when the data B stored in the second area 32 (when a plurality of data B exist, the data B stored in the last read address of the second area 32) is read out.

When a control clock signal S for data output is inputted via the control line 50, such control clock signal S is then transferred to a flip-flop 72 and is also inputted to a selector 73 as the control signal S2. An output of the gate circuit 74, to which an output of the flip-flop 72 and the control clock signal S are inputted, is inputted to this selector 73 as a control signal S1. When the chip 10 does not have the data output priority, an output of an AND gate 77 is in the "L" level. Therefore, a logic "0" is stored in the flip-flop 72 with an input of the control clock signal S, a signal of the "L" level is outputted from the Q output terminal, whereby the control signal S1 which is an output of the gate circuit 74 is maintained in the "H" level. When the chip comes to have the data output priority because the signal inputted from the priority signal input terminal 61 changes to the "H" level, an output of the AND gate 77 changes to the "H" level, a logic "1" is stored in the flip-flop 72 with the control clock signal S and its Q output changes to the "H" level. In this case, the control signal S1 as an output of the gate circuit 74 becomes the clock signal similar to the control signal S2. The selector 73 outputs the control signal S1 as the control signal S3 when a decoder 76, which will be explained later, outputs any read address of the second area 32 of the storage area 30 and switches the output of the control signal S2 to the control signal S3 in other cases, that is, when the decoder 76 outputs the read address of the first area 31 or the read address of the third area 33 of the storage area 30.

The control signal S3 outputted from the selector 73 is then inputted to an address controller 75. This address controller 75 sequentially updates the read address when the control signal S3 falls. The output signal of the address controller 75 is inputted to a decoder 76 for the decoding. The read address output of the decoder 76 is then supplied to the storage area 30. Moreover, the decoder 76 generates, as explained above, a switching control signal of the selector 73 and supplies this signal to the selector 73.

The data stored in the storage area 30 corresponding to the read address supplied from the decoder 76 is read. A tristate buffer 81 is arranged between the data read line of the storage area 30 and the output data bus 40 extended over a plurality of chips at the external side of the chip 10. The data read from the storage area 30 is then outputted to the output data bus 40 via the tristate buffer 81 when the tristate buffer 81 is in the ON state.

The ON/OFF states of the tristate buffer 81 are controlled by the gate circuit 82. The gate circuit 82 maintains, when the first priority signal PI_ of "L" level is inputted from the priority signal input terminal 61, its output to the "L" level and controls the tristate buffer 81 to the OFF state, then controls the tristate buffer 81 to the ON state until the priority flag stored in the priority flag register 34 of the chip 10 is reset after input of the first priority signal PI_ stops (changes to the "H" level) and also controls again the tristate buffer 81 to the OFF state when the priority flag stored in the priority flag register 34 is reset, namely when output of data B of the second area 32 of the storage area 30 of the chip 10 is completed. However, when the last stage connection flag which indicates that the chip 10 is connected to the last stage of the cascade connection is set to the last stage connection flag register 71, the tristate buffer 81 is also controlled to the ON state even after the priority flag stored in the priority flag register 34 is reset.

Figure 7:
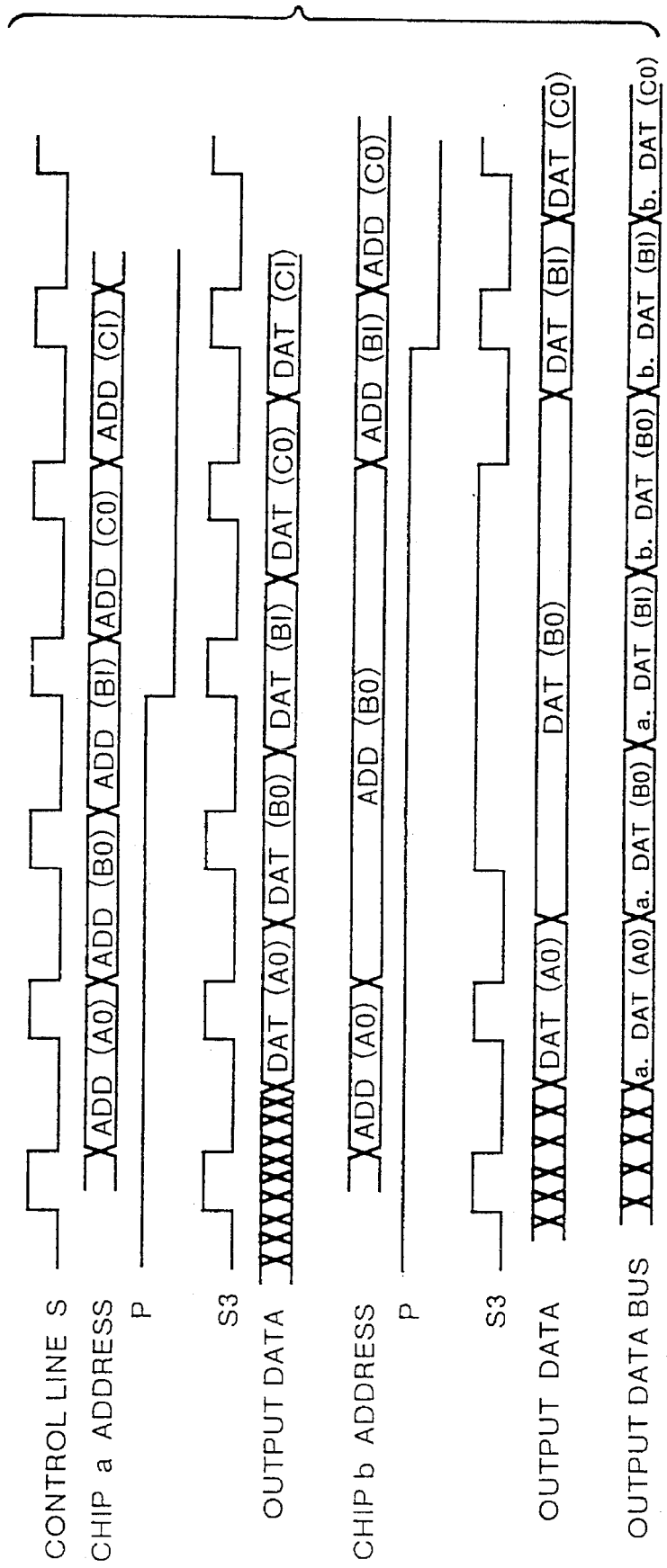
FIG. 7 is a timing chart indicating the data output timing in such a case that two associative memories shown in FIG. 6 are cascade-connected as shown in FIG. 5.

FIG. 7 is a timing chart representing the data output timing when only two chips shown in FIG. 6 are cascade-connected for simplification as shown in FIG. 5. Here, the chip connected in the front stage side is designated as the chip a, while the chip connected in the rear stage side as the chip b. Moreover, it is also assumed that only one data A (data A0) is stored in the first area 31, two data B (data B0 and data B1) in the second area 32 and two or more data C (data C0, data C1, . . . ) in the third area 33.

Since the chip a is connected to the first stage, the priority signal input terminal 61 of the chip a is pulled up to the condition where the signal of "H" level is always applied.

When the control clock signal S is inputted, since the chip a already has the data output priority, both control signals S1, S2 change like the control clock signal. Thereby, the selector 73 outputs in direct the input control clock signal S as the control signal S3. Meanwhile, the decoder 76 sequentially outputs the address ADD(A0) of data A0, address ADD(B0) of data B0 and address ADD (B1) , ADD (C0) , ADD (C1) , . . . in the same manner. However, the priority flag P of the chip a is reset in the timing that the last data B1 of the second area 32 is outputted. Thereby, the tristate buffer 81 is turned OFF from the ON state. Therefore, the chip a sequentially outputs the data up to the data B 1 (a, DAT(B1)), that is, the data A0 (a, DAT(A0)), data B0 (a, DAT(B0)) and data B1 (a, DAT(B1)).

Meanwhile, the chip b is not given the data output priority until the priority flag P of the chip a is reset. During this period, the tristate buffer 81 of the chip b is in the OFF state and therefore even when data is read from the storage area 30 of the chip b, such data is not outputted to the output data bus 40.

While the chip a has the data output priority, the control signal S1 of the chip b is fixed to the "H" level. In this period, the decoder 76 of the chip b outputs the address ADD(A0) of the data A0, and thereafter the address ADD(B0) of the data B0. In this timing, the selector 73 is switched to the side of control signal S1. Simultaneously, the read address as the output of the decoder 76 is no longer updated and the address ADD(B0) of the data B0 is continuously outputted.

When the chip a gives up the data output priority and the chip b comes in turn to have the data output priority, the tristate buffer 81 turns ON, the control signal S1 which is an output of the gate circuit 74 becomes the clock signal like the control clock signal S, an address outputted from the decoder 76 is updated and the data B0 (b, DAT(B0)), data B1 (b, DAT(B1)) of the chip b are sequentially outputted to the output data bus 40. In the chip b, the priority flag P is reset when the data B1 (b, DAT(B1)) is outputted. When chips are further connected in the rear stage side of the chip b, the data output priority is transferred to the next chip in above timing and the tristate buffer 81 of the chip b turns OFF. However, in this case, the chip b is connected to the last stage. Therefore, the last stage connection flag of logic "1" is stored in the last stage connection flag register 71 of the chip b. Accordingly, even when the priority flag P of the chip b is reset, the tristate buffer 81 of the chip b remains continuously in the ON state and the chip b subsequently outputs the data C0 (b, DAT(C0)), data C1 (b, DAT(C1)), . . . of the third area 33 to the output data bus 30. It can also be seen when the priority flag is not set in any chip.

As explained above, in the second embodiment shown in FIG. 6, the data A stored in the first area 31 is outputted only from the chip connected to the first stage, the data B stored in the second area 32 which is the intrinsic data of individual chips are sequentially outputted from all chips connected and the data C stored in the third area 33 is outputted only from the chip connected to the last stage. As explained previously, necessary data can be outputted completely without any duplication from the cascade-connected chips, realizing the effective data output operation.

The second embodiment shown in FIG. 6 is provided with the third area 33 for storing the data C common to a plurality of chips at the later address than that of the second area 32 for storing the data differed from each chip. Therefore, the last stage connection flag is necessary and this second embodiment is provided with the last stage connection flag register 71. However, it is allowed that the addresses are assigned so that the area for storing the data common to a plurality of chips is designated only as the first area 31 having younger addresses than that of the second area 32. In this case, the concept of the last stage connection flag is unnecessary and therefore the last stage connection flag register 71 can be eliminated.

However, when the data stored in the second area 32 for storing the data differed from each chip does not exist in all chips of cascade connection, that is, when the chip having the data output priority does not exist in all chips of cascade connection, the common data can be outputted from the chip connected to the last stage by providing the last stage connection flag register 71 as shown in FIG. 6.

Figure 8:
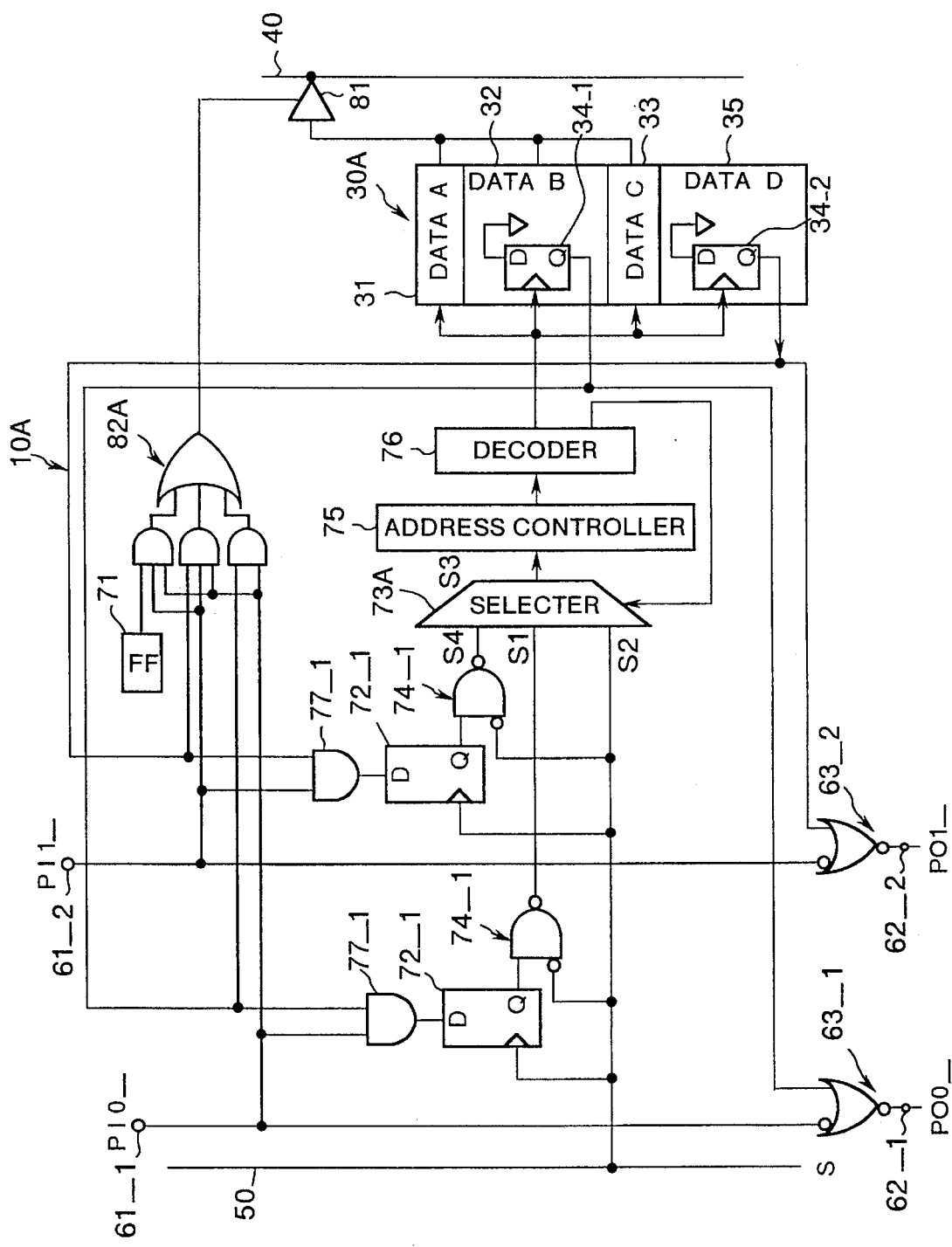
FIG. 8 is a circuit diagram of the part for data output of the third embodiment of the present invention.
Figure 9:
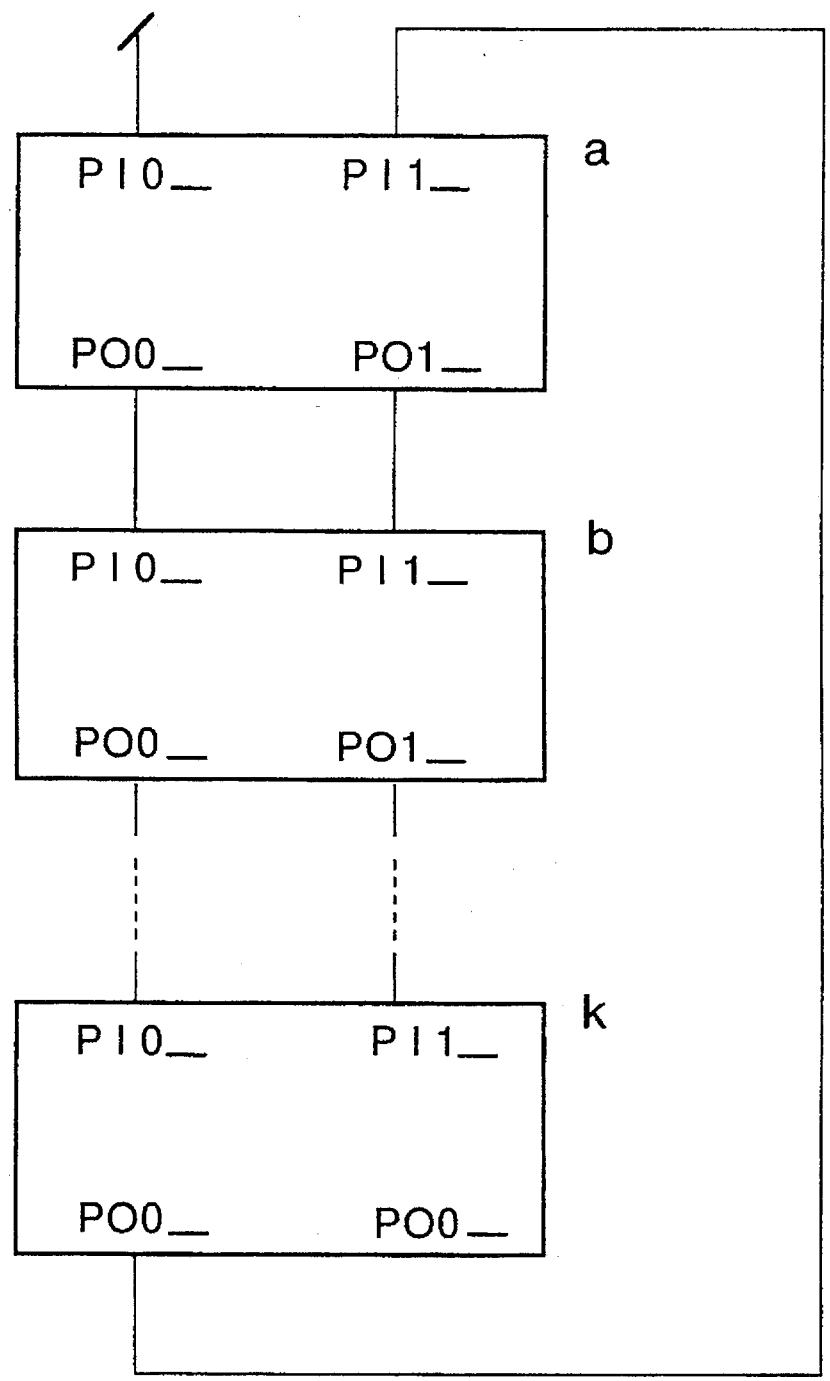
FIG. 9 is a schematic diagram illustrating details of cascade connection of a plurality of chips in the third embodiment of the present invention.

FIG. 8 is a circuit diagram of the part regarding data output of the third embodiment of the present invention. FIG. 9 is a schematic diagram indicating the cascade connection of a plurality of chips in the third embodiment of the present invention.

The storage area 30A of the chip 10A of the third embodiment shown in FIG. 8 is provided with a first area 31, a second area 32 and a third area 33 similar to those of the second embodiment (FIG. 6) and moreover provided, as in the case of the second area 32, with a fourth area 35 for storing the data D differed from each chip at the rear side of the address space than the third area 33. Therefore, the priority signal input terminal 61-2, priority signal output terminal 62-2, AND gate 77-2, flip-flop 72-2, gate circuit 74-2 and priority flag register 34-2 are also provided correspondingly to the fourth area 35, in addition to the priority signal input terminal 61-1, priority signal output terminal 62-1, AND gate 77-1, flip-flop 72-1, gate circuit 74-1 and priority flag register 34-1 corresponding to the second area 32. Moreover, the input of the selector 73A is increased up to three terminals and the gate circuit 82A for switching the tristate buffer 81 to ON and OFF states is also modified.

The chip 10A of the third embodiment is connected as shown in FIG. 9, where the data A, data B are first outputted from the chip a and only the data B is outputted from the chips in the sequence of chip b, . . . , chip k. Thereafter, the data C and data D are outputted again from the chip a and the data D is then sequentially outputted from the chips in the sequence of chip b, . . . , chip k.

Figure 10:
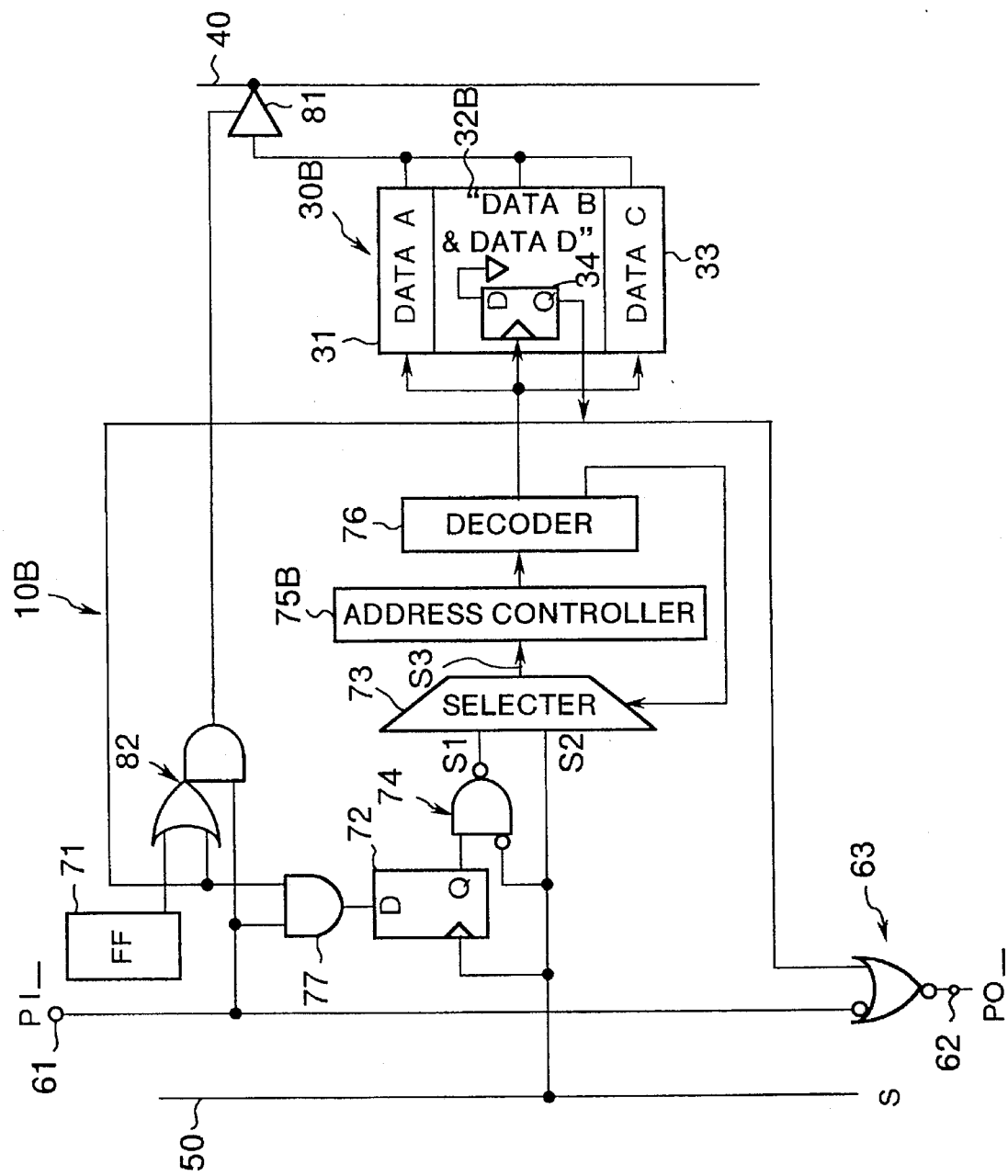
FIG. 10 is a circuit diagram of the part for data output of the fourth embodiment of the present invention.

FIG. 10 is a circuit diagram of the part regarding data output of the fourth embodiment of the present invention.

A circuit diagram of a chip 10B of this fourth embodiment is similar, in the expression, to the second embodiment but the data B and data D which are data differed from each chip are stored in the second area 32B of the storage area 30B of the chip 10B. In this circuit diagram, both data B and data D are stored in the second area 32B and these data B and D may also be stored, for example, in the different storage areas as in the case of the third embodiment. However, in the fourth embodiment, only one priority flag register 34 is provided correspondingly to both storage area to store the data B and the storage area to store the data D.

The address controller 75B makes the decoder 76 to generate a read address of the first area 31 and sends, when generation of the read address of the first area 31 is completed and generation of the read address of the second area starts, thereto a signal to alternately generate the read address of data B and that of data D. That is, when three data B0, B1, B2 exist as the data B and three data D0, D1, D2 as the data D, the read address ADD are output from the decoder 76 in the sequence of ADD(B0)→ADD(D0)→ADD (B1)→ADD (D1)→ADD (B2)→ADD (D2). The priority flag is reset when the last data (data D2 in this example) of the second area 32B is outputted.

This structure prevents duplicated output of the same data, even when the area for storing the data common to a plurality of chips and the area for storing data differed from each chip are complicatedly arranged on the addresses and completely outputs the necessary data.

Figure 11:
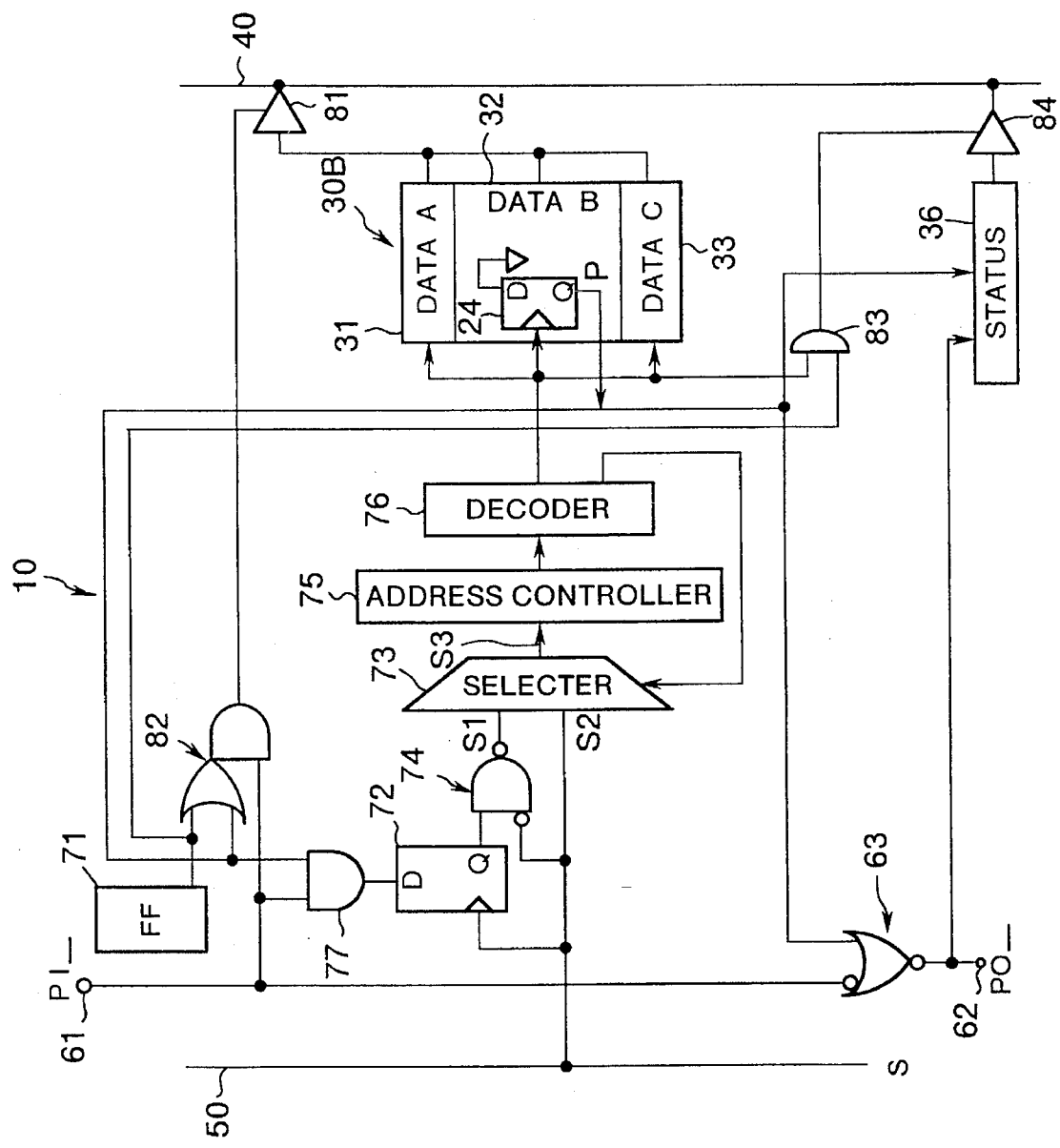
FIG. 11 is a circuit diagram of the part for data output of the fifth embodiment of the present invention.

FIG. 11 illustrates a fifth embodiment of the present invention. This embodiment has added, to the second embodiment, a storage register 36 for storing the information (third priority signal) indicating whether the certain chip has the priority or not and the information (second priority signal) indicating whether the upstream side chips including the certain chip has the priority or not, an AND gate 83 and a tristate buffer 84 for controlling an output of the storage register 36.

In the case of outputting the data of this storage register 36, such data can be outputted from the chip which is recognized as to be connected to the last stage by the last stage flag register only by designating an address even if a particular chip is not designated for the chips of cascade connection. Namely, since an output of the AND gate 83 becomes "1" when the status information output is designated with an address and the chip is the last stage chip, the tristate buffer 84 becomes ON and thereby data is outputted to the output data bus 40. Accordingly, the status information as a system of the cascade connection can easily be obtained within a short period.

It is to be understood that while the foregoing illustrates the preferred embodiments and method of the present invention, other variations are possible. All such variations as would be obvious to one skilled in this art are intended to be included within the scope of the invention defined by the following claims.

What is claimed is:

1. An associative memory comprising:

at least one associative memory device, the at least one associative memory device being cascade-connected, external devices coupled to the associative memory storing data in the at least one associative memory device and retrieving the data from the at least one associative memory device by providing reference date to the at least one associative memory device, each of the at least one associative memory device comprising:

a retrieval result register, the retrieval result register storing retrieval result data of each of the at least one associative memory device and of a portion of the at least one associative memory device connected to an upstream side of each of the at least one associative memory device;

identification means for identifying that each of the at least one associative memory device is a last stage associative memory device of the associative memory, the identification means generating an identifying signal when each of the at least one associative memory device is the last stage associative memory device; and an output control circuit coupled to the identification means and the retrieval result register, the output control circuit outputting to the external devices the retrieval result data in the retrieval result register when the identification means generates the identifying signal.

2. The associative memory of claim 1, wherein the identification means generates the identifying signal based on an identification code.

3. The associative memory of claim 2, further comprising:

an identification number register coupled to the identification means, the identification number register storing an identification number, the identification number identifying each of the at least one associative memory device and storing the identification code.

4. The associative memory of claim 3, wherein the identification number is an upper address of an address data received by each of the at least one associative memory device from the external devices.

5. The associative memory of claim 3, wherein the identification code is stored in a most significant bit of the identification number register.

6. The associative memory of claim 1, wherein the identification means is an identification terminal.

7. The associative memory of claim 1, wherein the retrieval result register stores:

a) a first hit signal generated by each of the at least one associative memory device, when active, the first hit signal indicating that data stored in each of the at least one associative memory device match the reference data, b) a second hit signal received by each of the at least one associative memory device, when active, the second hit signal indicating that data stored in the portion of the at least one associative memory device connected to the upstream side of each of the at least one associative memory device match the reference data, c) a first address generated by each of the at least the associative memory device, the first address corresponding to a highest priority data in each of the at least one associative memory device that matches the reference data, and d) a second address received by each of the at least one associative memory device, the second address corresponding to a highest priority data in the portion of the at least one associative memory device connected to the upstream side of each of the at least one associative memory device that matches the reference data.

8. The associative memory of claim 7, wherein if at least one of the first and second hit signals is active, then a third hit signal is set to active, the third hit signal and one of the first and second addresses being output to a portion of the at least one associative memory device connected to a downstream side of each of the at least one associative memory device.

9. The associative memory of claim 8, wherein the data stored in the portion of the at least one associative memory device connected to the upstream side of each of the at least one associative memory device has a higher priority than the data stored in each of the at least one associative memory device.

10. The associative memory of claim 8, further comprising:

an electric circuit that generates the second hit signal and the second address received by a first associative memory device of the associative memory, the electronic circuit setting the second hit signal to inactive and the second address to a preset value.

11. The associative memory of claim 8, wherein an integrated retrieval result of the associative memory is stored in the last stage associative memory device.

12. An associative memory, comprising:

a plurality of associative memory devices, the plurality of associative memory devices being cascade-connected, each of the plurality of associative memory devices retrieving data from a memory based on reference data; and an output data bus connected to the plurality of associative memory devices, the plurality of associative memory devices sequentially outputting the retrieved data of each of the plurality of associative memory devices to the output data bus, wherein each of the plurality of associative memory devices comprises:

a priority signal input terminal that inputs a priority signal, the priority signal being active when a portion of the plurality of associative memory devices connected to an upstream side of each of the plurality of associative memory devices have priority to output retrieved data to the output data bus; and a data output control circuit coupled to the priority signal input terminal that outputs the retrieved data of each of the plurality of associative memory devices to the output data bus when the priority signal is inactive and the data in the memory match the reference data.

13. An associative memory, comprising:

a plurality of associative memory devices, the plurality of associative memory devices being cascade-connected, each of the plurality of associative memory devices having a memory that contains a first storage area storing a first data and a second storage area storing a second data, the first data of the plurality of associative memory devices having identical values, the second data of the plurality of associative memory devices having different values; and an output data bus connected to the plurality of associative memory devices, the plurality of associative memory devices sequentially outputting the first and second data of each of the plurality of associative memory devices to the output data bus, wherein each of the plurality of associative memory devices comprises:

a priority signal input terminal that inputs a first priority signal, the first priority signal being active when a portion of the plurality of associative memory devices connected to an upstream side of each of the plurality of associative memory devices have priority to output one of the first and second data to the output data bus;

a priority signal output terminal that outputs a second priority signal, each of the plurality of associative memory devices setting the second priority signal to active when one of each of the plurality of associative memory devices and the portion of the plurality of associative memory devices connected to the upstream side of each of the plurality of associative memory devices have priority to output one of the first and second data to the output data bus;

a priority flag register coupled to the priority signal output terminal, the priority flag register storing a priority flag, each of the plurality of associative memory devices setting the priority flag to active when the second data is written into the second storage area and setting the priority flag to inactive when the second data is output to the output data bus;

a priority transfer circuit coupled to the priority signal input terminal and the priority flag register, the priority transfer circuit setting the second priority signal to active if one of the first priority signal is active and the priority flag is active, the priority transfer circuit setting the second priority signal to inactive if the first priority signal is inactive and the priority flag is inactive; and a data output control circuit coupled to the priority signal input terminal and the priority flag register, the data output control circuit outputting the first and second data to the output data bus, wherein the data output control circuit outputs the first data once in the associative memory, the data output control circuit outputting the second data if the first priority signal is inactive and the priority flag is active.

14. The associative memory of claim 13, wherein the data output control circuit comprises:

an address update circuit that updates a read address of the memory of each of the plurality of associative memory devices for each time the first data is output to the output data bus, after the read address is updated to a beginning address of the second storage area, the address update circuit maintaining the read address at the beginning address while the first priority signal is active and updating the read address for outputting the second data to the output data bus while the first priority signal is inactive; and a data transfer circuit that prevents the first and second data from being output to the output data bus while the first priority signal is active and permits the first and second data to be output to the output data bus while the first priority signal is inactive and the priority flag is active.

15. The associative memory of claim 14, further comprising:

identification means for setting a last stage signal of each of the plurality of associative memory devices to active if each of the plurality of associative memory devices is a last stage associative memory device of the associative memory, and inactive if each of the plurality of associative memory devices is not a last stage associative memory device of the associative memory; and last stage recognizing means for recognizing whether the last stage signal is active, wherein while the first priority signal is inactive and the priority flag is inactive, the data transfer circuit prevents the first and second data from being output to the output data bus when the last stage signal is inactive and permits the first and second data to be output to the output data bus when the last stage signal is active.

16. The associative memory of claim 14, wherein:

the second storage area comprises a plurality of sub-storage areas storing a corresponding second sub-data of the second data, the beginning address comprising a plurality of sub-beginning addresses, each of the plurality sub-beginning addresses corresponding to one of the plurality of sub-storage areas; and the priority flag register comprises a plurality of sub-priority flag registers, each of the plurality of sub-priority flag registers corresponding to one of the plurality of sub-storage areas, wherein for each of the plurality of sub-storage areas, the address update circuit maintains the read address at the corresponding one of the plurality of sub-beginning addresses while the first priority signal is active and updates the read address for outputting the corresponding second sub-data to the output data bus while the first priority signal is inactive, each of the plurality of sub-priority flag registers being set to inactive after the corresponding second sub-data is output to the output data bus.

17. The associative memory of claim 14, wherein:

the second storage area comprises a plurality of sub-storage areas storing a corresponding second sub-data of the second data, the beginning address comprising a plurality of sub-beginning addresses, each of the plurality sub-beginning addresses corresponding to one of the plurality of sub-storage areas;

the priority signal input terminal comprises a plurality of first sub-priority signal input terminals that input a plurality of first sub-priority signals;

the priority signal output terminal comprises a plurality of sub-priority signal output terminals that output a plurality of second sub-priority signals, each of the plurality of first and second sub-priority signals corresponding to one of the sub-storage areas, each of the plurality of second sub-priority signals being set to active when one of each of the plurality of associative memory devices and the portion of the plurality of associative memory devices connected to the upstream side of each of the plurality of associative memory devices have priority to output one of the first data and the corresponding second sub-data; and the priority flag register comprises a plurality of sub-priority flag registers that store a plurality of sub-priority flags, each of the plurality of sub-priority flags corresponding to one of the plurality of sub-storage areas, each of the plurality of sub-priority flags being set to active when the corresponding second sub-data is written into the corresponding one of the plurality of sub-storage areas and inactive when the corresponding second sub-data is output from the corresponding one of the plurality of sub-storage areas to the output data bus, wherein for each of the plurality of sub-storage areas:

a) the address update circuit maintains the read address at one of the plurality of sub-beginning addresses while the corresponding one of the plurality of first sub-priority signal is active and updates the read address for outputting the corresponding second sub-data to the output data bus while the corresponding one of the plurality of first sub-priority signal is inactive, and b) the data transfer circuit prevents the first and second data from being output to the output data bus while one of the plurality of first sub-priority signal is active and permits the first and second data to be output to the output data bus while one of the plurality of first sub-priority signal is inactive and the corresponding one of the plurality of sub-priority flag is active.

18. The associative memory of claim 13, further comprising:

identification means for setting a last stage signal of each of the plurality of associative memory devices to active if each of the plurality of associative memory devices is a last stage associative memory device; and last stage recognizing means for recognizing that each of the plurality of associative memory devices is a last stage associative memory device when the last stage signal is active, wherein if each of the plurality of associative memory devices is the last stage associative memory device, then each of the plurality of associative memory devices outputs the first data if the plurality of associative memory devices do not contain the second data.

19. The associative memory of claim 13, further comprising:

identification means for identifying that each of the plurality of associative memory devices is a last stage associative memory device of the associative memory; and a priority storage circuit that stores status data that includes the second priority signal and a third priority signal, wherein when active, the third priority signal permits each of the plurality of associative memory devices to output the status data to the output data bus if each of the plurality of associative memory devices is identified by the identification means as the last stage associative memory device.

20. An associative memory, comprising:

an least one associative memory device, the at least one associative memory device being cascade-connected external devices coupled to the associative memory storing data into the at least one associative memory device and retrieving the stored data from the at least one associative memory device as retrieved data by providing reference data to the at least one associative memory device, each of the at least one associative memory device comprising:

a retrieval result register, the retrieval result register snoring a retrieval status of each of the at least one associative memory device and a retrieval status of a portion of the at least one associative memory device connected to an upstream side of each of the at least one associative memory device;

identification means for setting an identifying signal to active if each of the at least one associative memory device is a last stage associative memory device of the associative memory;

a priority signal input terminal that inputs a priority signal, the priority signal being active when the portion of the plurality of associative memory devices connected to an upstream side of each of the at least one associative memory device has priority to output data to the output data bus, the data output to the output data bus including an address; and an output control circuit coupled to the identification means and the retrieval result register, the output control circuit outputting to the external devices a retrieval status of the associative memory when the identifying signal is active, the output control circuit outputting a retrieved data of each of the at least one associative memory device if the priority signal is inactive and each of the at least one associative memory device contains data that correspond to the reference data.

* * * * *

UNITED STATES PATENT AND TRADEMARK OFFICE
CERTIFICATE OF CORRECTION

PATENT NO. : 5,568,416
DATED : October 22, 1996
INVENTOR(S) : KAWANA et al.

It is certified that error appears in the above-indentified patent and that said Letters Patent is hereby corrected as shown below:

In the Claims:

Column 15, line 54, replace "date" with --data--.

Column 20, line 37, replace "snoring" with --storing--.

Signed and Sealed this

Fifteenth Day of April, 1997

Attest:

BRUCE LEHMAN

Attesting Officer    Commissioner of Patents and Trademarks